United States Patent
Enomoto

(10) Patent No.: US 8,483,989 B2
(45) Date of Patent: Jul. 9, 2013

(54) HEATING ELEMENT TEMPERATURE ESTIMATION APPARATUS

(75) Inventor: Takayuki Enomoto, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 193 days.

(21) Appl. No.: 12/972,960

(22) Filed: Dec. 20, 2010

(65) Prior Publication Data
US 2011/0172947 A1    Jul. 14, 2011

(30) Foreign Application Priority Data

Jan. 12, 2010  (JP) ................. 2010-003903

(51) Int. Cl.
- *G01K 7/00* (2006.01)
- *G01K 3/00* (2006.01)
- *G01K 3/08* (2006.01)
- *G01B 5/00* (2006.01)

(52) U.S. Cl.
USPC .............. 702/130; 702/33; 374/101; 374/137

(58) Field of Classification Search
USPC ................ 702/130, 33; 374/101, 102, 107, 374/110, 137
See application file for complete search history.

(56) References Cited

U.S. PATENT DOCUMENTS

| | | | |
|---|---|---|---|
| 4,729,424 A | 3/1988 | Mizuno et al. | |
| 7,748,895 B2 * | 7/2010 | Sri-Jayantha et al. | 374/134 |
| 7,972,012 B2 * | 7/2011 | Kato | 353/52 |
| 2002/0157821 A1 | 10/2002 | Beitelmal et al. | |
| 2005/0216221 A1 * | 9/2005 | Broyles et al. | 702/132 |
| 2006/0032250 A1 | 2/2006 | Flanigan et al. | |
| 2008/0043807 A1 * | 2/2008 | Yazawa et al. | 374/141 |
| 2009/0109621 A1 | 4/2009 | Cheng | |
| 2009/0323277 A1 | 12/2009 | Hosokawa | |

FOREIGN PATENT DOCUMENTS

| | | |
|---|---|---|
| JP | 2006-114575 A | 4/2006 |

* cited by examiner

*Primary Examiner* — Michael Nghiem
*Assistant Examiner* — Ricky Ngon
(74) *Attorney, Agent, or Firm* — Arent Fox LLP

(57) ABSTRACT

In an apparatus for estimating a temperature of a heating element such as IGBT mounted on an electronic printed circuit board, a first temperature and a second temperature at positions away from the heating element are detected, and it is determined whether a cooling device is operative. The temperature of the heating element is estimated based on the first and second temperatures using a first equation when the cooling device is inoperative, whereas it is estimated using a second equation when the cooling device is operative, thereby enabling to accurately estimate the temperature of the heating element equipped with the cooling device.

8 Claims, 2 Drawing Sheets

US 8,483,989 B2

HEATING ELEMENT TEMPERATURE ESTIMATION APPARATUS

BACKGROUND OF THE INVENTION

1. Field of the Invention

This invention relates to a heating element temperature estimation apparatus, particularly to an apparatus for estimating a temperature of a heating element such as a power semiconductor device like a MOSFET, mounted on an electronic printed circuit board and having heat generating property.

2. Description of the Related Art

Conventionally, there is proposed a technique for estimating temperature of a heating element so as to estimate its duration of life from the estimated temperature, as taught, for example, by Japanese Laid-Open Patent Application No. 2006-114575, in which two diodes are separately installed at the heating element to detect a temperature difference therebetween. Specifically, a difference between voltages at which diodes become conductive is used as the temperature difference and the duration of life of the heating element is estimated by comparing the detected temperature difference with a reference value.

SUMMARY OF THE INVENTION

Since it is difficult to install a temperature detector at the heating element due to the wiring limitation, a configuration may be applied to install a temperature detector at a position distant away from the heating element.

However, the heating element is usually equipped with a cooling device such as blower that is made ON/OFF in response to the operation of the heating element. Since the temperature of the heating element is greatly influenced by the ON/OFF condition of the cooling device, it is difficult to estimate the heating element temperature accurately from the output of the detector.

An object of this invention is therefore to overcome the foregoing drawbacks by providing a heating element temperature estimation apparatus that can accurately estimate a temperature of a heating element equipped with a cooling device that is made ON/OFF in response to the operation of the heating element.

In order to achieve the object, this invention provides in a first aspect an apparatus for estimating a temperature of a heating element mounted on an electronic printed circuit board, comprising: a first temperature detector installed at a position away from the heating element by a first distance and adapted to produce an output indicative of temperature of the installed position; a second temperature detector installed at a position away from the heating element by a second distance greater than the first distance and adapted to produce an output indicative of temperature of the installed position; a cooling device adapted to be operative to cool the heating element; a cooling operation determiner that determines whether the cooling device is operative; and a heating element temperature estimator that estimates the temperature of the heating element based on temperatures detected from the outputs produced by the first and second temperature detectors using a first equation when the cooling device is determined to be inoperative, whereas estimates the temperature of the heating element based on the temperatures detected from the outputs produced by the first and second temperature detectors using a second equation when the cooling device is determined to be operative.

In order to achieve the object, this invention provides in a second aspect a method for estimating a temperature of a heating element mounted on an electronic printed circuit board, comprising the steps of: detecting a first temperature at a position away from the heating element by a first distance; detecting a second temperature at a position away from the heating element by a second distance greater than the first distance; determining whether a cooling device adapted to be operative to cool the heating element is operative; and estimating the temperature of the heating element based on the first and second temperatures using a first equation when the cooling device is determined to be inoperative, whereas estimates the temperature of the heating element based on the first and second temperatures using a second equation when the cooling device is determined to be operative.

BRIEF DESCRIPTION OF THE DRAWINGS

The above and other objects and advantages of the invention will be more apparent from the following description and drawings in which.

DETAILED DESCRIPTION OF THE PREFERRED EMBODIMENT

A preferred embodiment of a heating element temperature estimation apparatus according to the invention will now be explained with reference to the attached drawings.

Figure 1:
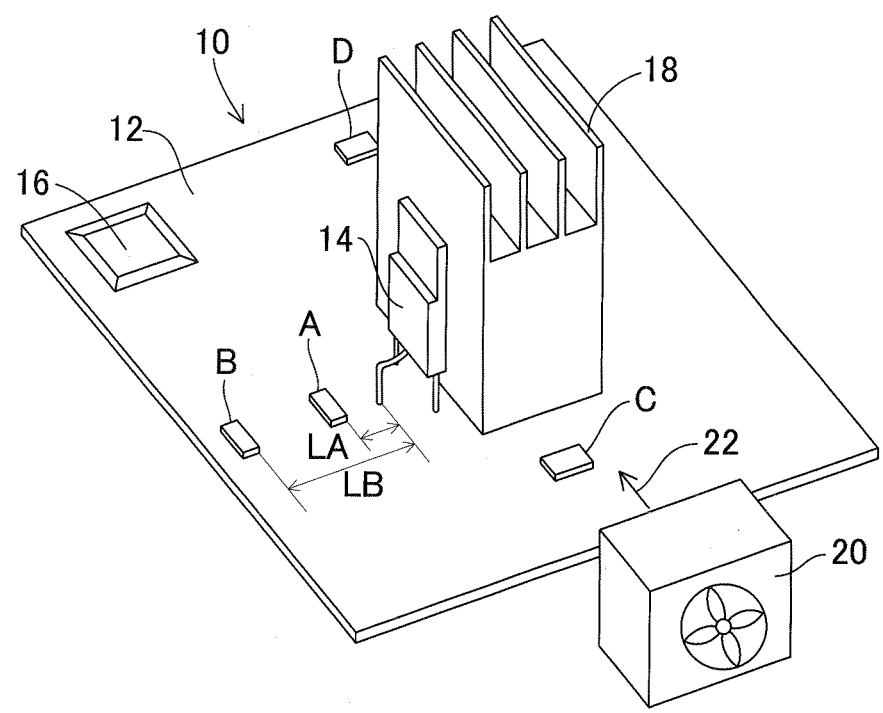
FIG. 1 is an overall perspective view of a heating element temperature estimation apparatus according to an embodiment of this invention.

FIG. 1 is an overall perspective view of a heating element temperature estimation apparatus according to an embodiment of this invention.

In FIG. 1, symbol 10 indicates a heating element temperature estimation apparatus. The apparatus 10 comprises a heating element 14 mounted on an electronic printed circuit board 12, a first temperature detector A installed at a position away from the heating element 14 by a first distance LA and adapted to produce an output indicative of temperature of the installed position, a second temperature detector B installed at a position away from the heating element 14 by a second distance LB (that is greater than the first distance LA), an calculator (comprising CPU) 16 that acquires temperatures detected by the detectors A, B to calculate or estimate a temperature of the heating element 14.

The circuit board 12 is made of resin material and a circuit pattern (not shown) is formed thereon. The heating element 14 comprises a switching element such as an IGBT (Insulated Gate Bipolar Transistor) or a MOSFET (Metal Oxide Semiconductor Field Effect Transistor), i.e., a power semiconductor device that generates a lot of heat during switching operation.

Each of the first and second temperature detectors A, B comprises a thermistor made of a resistor element having a high temperature coefficient of resistance. The first and second detectors A, B are mounted on the circuit board 12 to generate an output indicative of the temperatures at or around the mounted positions.

The apparatus 10 further comprises a heat sink 18 attached to the heating element 14, a blower (cooling device) 20 provided for cooling the heating element 14 by cooling the heat sink 18, a third temperature detector C installed between the heat sink 18 and the blower 20, and a fourth temperature detector D installed at a location opposite to the third temperature detector C relative to the heating element 14 and heat sink 18.

Specifically, the third temperature detector C is installed at a position upstream of the heating element 14 and heat sink 18 in a flow of cooled air 22 from the blower 20 and the fourth temperature detector D is installed at a position downstream thereof. The blower 20 has a fan and cools the heating element 14 by rotating the fan to produce the cooled air 22.

The third and fourth temperature detectors C, D also comprise thermistors and are mounted on the circuit board 12 for producing an output indicative of the temperatures at or around the mounted positions.

As will be understood, the detectors A, B, C and D are arranged such that a line connecting the detectors A and B and a line connecting the detectors C and D are substantially orthogonal to each other.

Figure 2:
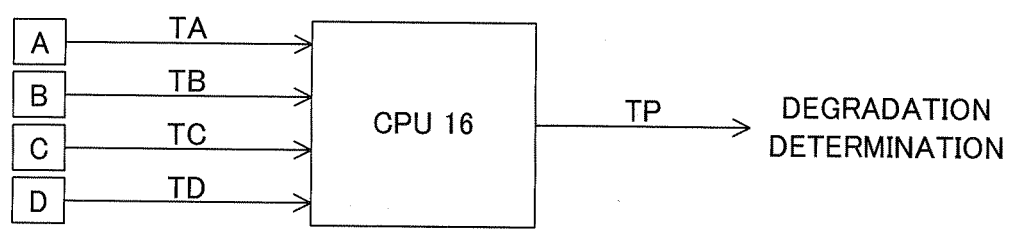
FIG. 2 is a block diagram showing the structure of the apparatus shown in FIG. 1.

FIG. 2 is a block diagram showing the structure of the apparatus 10.

The calculator 16 is inputted with temperatures TA, TB, TC and TD respectively detected (detected from the outputs produced) by the first to fourth temperature detectors A, B, C and D. Based on the inputted temperatures TA, TB, TC and TD, the calculator 16 calculates or estimates a temperature TP of the heating element 14. The calculated temperature TP is used for determining degradation of the heating element 14.

Figure 3:
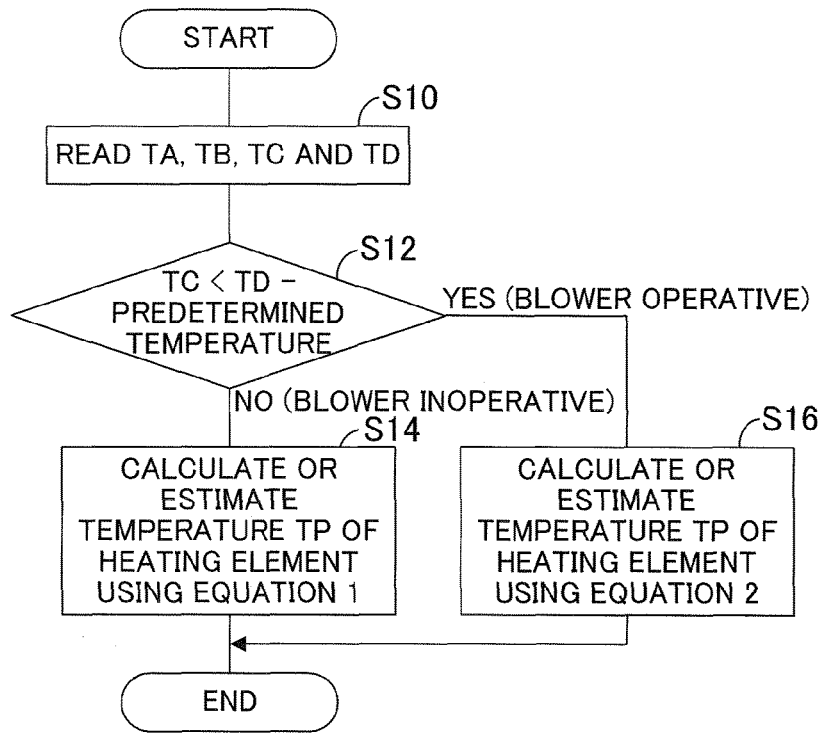
FIG. 3 is a flowchart showing the operation of the apparatus shown in FIG. 1.

FIG. 3 is a flowchart showing the operation of the apparatus 10. The illustrated program is executed by the calculator 16 at predetermined intervals, e.g., 100 milliseconds, after the apparatus 10 is activated.

The program begins at S10, in which the temperatures TA, TB, TC and TD detected (detected from the outputs produced) by the first to fourth temperature detectors A, B, C and D are read.

The program proceeds to S12, in which a predetermined temperature (e.g., 5 degrees) is subtracted from the temperature TD detected by the fourth temperature detector D, and it is determined whether the temperature TC detected by the third temperature detector C is lower than a value obtained by subtracting the predetermined temperature from the temperature output TD.

When the result in S12 is negative, it can be judged that the temperature TD downstream of the heating element 14 and the temperature TC upstream thereof are substantially the same and hence, it can be judged that the fan of the blower 20 is not operated (blower inoperative).

Accordingly the program proceeds to S14, in which the temperature TP of the heating element 14 is calculated or estimated using the following Equation 1.

$$TP = \frac{TA \cdot LB - TB \cdot LA}{LB - LA} \qquad \text{Equation 1}$$

In contrast, when the result in S12 is affirmative, since it can be judged that the temperature TD on the downstream side is higher than the temperature TC on the upstream side to some extent and hence, it can be judged that the fan of the blower 20 is operated (blower operative). This is because the cooled air 22 is warmed or heated by the heating element 14 and heat sink 18 and increases the temperature output TD on the downstream side.

As a result, when the result in S12 is affirmative, the program proceeds to S16, in which the temperature TP of the heating element 14 is calculated or estimated using the following Equation 2.

$$TP = \frac{TA \cdot LB - \alpha TB \cdot LA - (1 - \alpha)TA \cdot LA}{LB - LA} \qquad \text{Equation 2}$$

In the Equations 1 and 2, $\alpha$ is a coefficient that is set within a range of $0 < \alpha < 1$.

Figure 4:
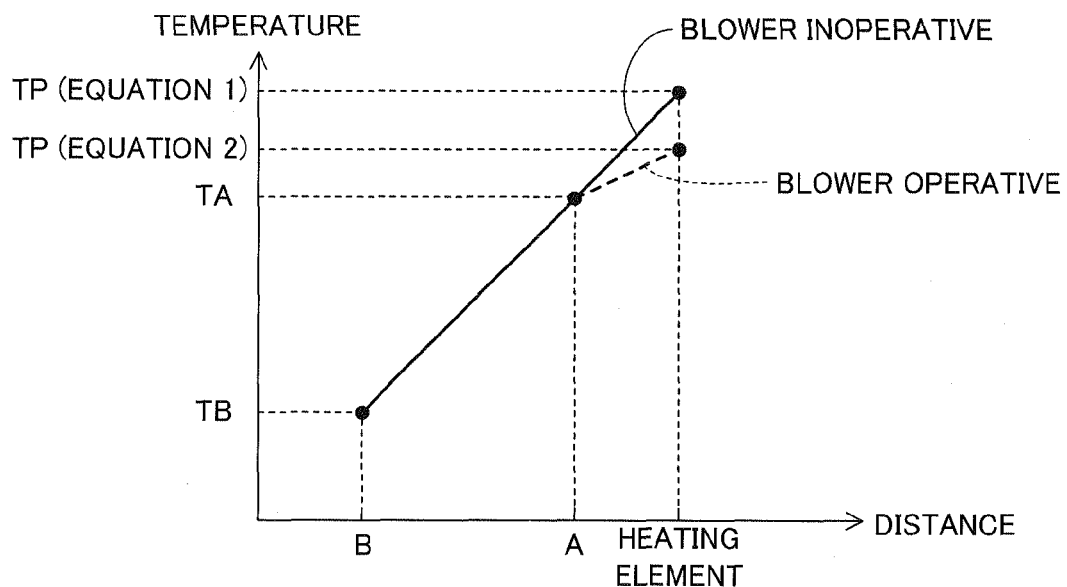
FIG. 4 is a graph for explaining temperature estimation conducted by the apparatus shown in FIG. 1.

FIG. 4 is a graph for explaining temperature estimation using the Equations 1 and 2.

The abscissa indicates the distances of the first and second temperature detectors A, B from the heating element 14, and the ordinate indicates temperatures at the positions.

Based on the characteristics shown in FIG. 4, in this embodiment, Equation 1 is built to calculate or estimate the temperature of the heating element 14 from a temperature gradient of the temperatures TA and TB detected by the first and second temperature detectors A and B, as can be seen from a solid line of FIG. 4.

Equation 2 is built to calculate or estimate the temperature of the heating element 14 based on a value obtained by multiplying the temperature gradient of the temperatures TA and TB by the coefficient $\alpha$, as can be seen from a dashed line in the figure.

Specifically, it is considered that, when the blower 20 is operative, the temperature of the heating element 14 can be calculated or estimated by multiplying the temperature gradient by the coefficient $\alpha$, since, as shown in FIG. 4, the temperature gradient of the heating element 14 and the first temperature detector A (in dashed line) decreases compared to that of the first temperature detector A and the second temperature detector B (in solid line).

The coefficient $\alpha$ is a value proportional to a difference between the temperatures TC and TD detected by the third and fourth temperature detectors C and D. In other words, the coefficient $\alpha$ represents how much the heating element 14 is cooled by the fan of the blower 20. Therefore, when the blower 20 is operative, the temperature of the heating element 14 can be estimated based on the temperatures TA, TB, TC and TD detected by the first to fourth temperature detectors A, B, C and D.

As mentioned above, the calculated temperature TP can be used for determining degradation of the heating element 14.

As stated above, the embodiment is configured to have an apparatus and a method for estimating a temperature of a heating element (14) mounted on an electronic printed circuit board (12), characterized by: a first temperature detector (A, calculator 16, S10) installed at a position away from the heating element by a first distance and adapted to produce an output indicative of temperature of the installed position; a second temperature detector (B, calculator 16, S10) installed at a position away from the heating element by a second distance greater than the first distance and adapted to produce an output indicative of temperature of the installed position; a cooling device (blower 20) adapted to be operative to cool the heating element; a cooling operation determiner (calculator 16, S12) that determines whether the cooling device is operative; and a heating element temperature estimator (calculator 16, S12, S14) that estimates the temperature of the heating element based on temperatures (TA, TB) detected from the outputs produced by the first and second temperature detectors using a first equation when the cooling device is determined to be inoperative (when it is determined that the cooling device is not operated), whereas estimates the temperature of the heating element based on the temperatures (TA, TB) detected from the outputs produced by the first and second temperature detectors using a second equation when the cooling device is determined to be operative (when it is determined that the cooling device is operated).

Specifically, when the temperature of the heating element 14 is estimated based on the temperature gradient obtained through the two temperature detectors that are installed different distances away from the heating element 14, the different equation is used for estimation depending on whether the cooling device (blower 20) is operated or not.

With this, even when the operating condition of the cooling device for the heating element 14 is changed between the ON state and OFF state, the temperature of the heating element can be accurately estimated.

In the apparatus and method, the cooling device (20) comprises a blower that produces cooled air to be supplied to the heating element and the cooling operation determiner includes: a third temperature detector (C, calculator 16, S10) installed at a position upstream of the heating element in flow of the cooled air and adapted to produce an output indicative of temperature of the installed position; a fourth temperature detector (D, calculator 16, S10) installed at a position downstream of the heating element in flow of the cooled air and adapted to produce an output indicative of the temperature of the installed position; and determines whether the cooling device is operative based on temperatures (TC, TD) detected from the outputs produced by the third and fourth temperature detectors (S12).

With this, it becomes possible to appropriately determine whether the cooling device is operated, with simple structure.

In the apparatus and method, the cooling operation determiner determines that the cooling device is operative when the temperature (TC) detected from the output produced by the third temperature detector is lower than a value obtained by subtracting a predetermined temperature from the temperature (TD) detected from the output produced by the fourth temperature detector (S12).

In the apparatus and method, the first and second temperature detectors comprise thermistors, the third and fourth temperature detectors comprises thermistors, and the heating element comprises an IGBT or a MOSFET.

It should be noted that, in the foregoing, although the heating element 14 is cooled through the heat sink 18 by the fan of the blower 20, the heat sink 18 is not indispensable and can be removed.

It should also be noted that, although the IGBT and MOSFET are exemplified as the heating element, another semiconductor element can instead be applied.

Japanese Patent Application No. 2010-003903, filed on Jan. 12, 2011, is incorporated by reference herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. An apparatus for estimating a temperature of a heating element mounted on an electronic printed circuit board, comprising:
    a first temperature detector installed at a position away from the heating element by a first distance and adapted to produce an output indicative of temperature of the installed position;
    a second temperature detector installed at a position away from the heating element by a second distance greater than the first distance and adapted to produce an output indicative of temperature of the installed position;
    a cooling device adapted to be operative to cool the heating element:
    a cooling operation determiner that determines whether the cooling device is operative; and
    a heating element temperature estimator that estimates the temperature of the heating element based on temperatures detected from the outputs produced by the first and second temperature detectors using a first equation when the cooling device is determined to be inoperative, and using a second equation when the cooling device is determined to be operative;
    wherein the cooling device comprises a blower that produces cooled air to be supplied to the heating element, and the cooling operation determiner includes:
    a third temperature detector installed at a position upstream of the heating element in flow of the cooled air and adapted to produce an output indicative of temperature of the installed position; and
    a fourth temperature detector installed at a position downstream of the heating element in flow of the cooled air and adapted to produce an output indicative of temperature of the installed position; and
    the cooling operation determiner determines that the cooling device is operative when the detected temperature of the third temperature detector is lower than a value obtained by subtracting a predetermined temperature from the detected temperature of the fourth temperature detector.

2. The apparatus according to claim 1, wherein the first and second temperature detectors comprise thermistors.

3. The apparatus according to claim 1, wherein the third and fourth temperature detectors comprise thermistors.

4. The apparatus according to claim 1, wherein the heating element comprises an IGBT or a MOSFET.

5. A method for estimating a temperature of a heating element mounted on an electronic printed circuit board, comprising:
    detecting a first temperature at a position away from the heating element by a first distance;
    detecting a second temperature at a position away from the heating element by a second distance greater than the first distance;
    determining whether a cooling device adapted to be operative to cool the heating element is operative, wherein the cooling device comprises a blower that produces cooled air to be supplied to the heating element;
    estimating, by at least one processor, the temperature of the heating element based on the first and second temperatures using a first equation when the cooling device is determined to be inoperative, and using a second equation when the cooling device is determined to be operative;
    detecting a third temperature at a position upstream of the heating element in flow of the cooled air;
    detecting a fourth temperature at a position downstream of the heating element in flow of the cooled air; and
    determining that the cooling device is operative upon detecting the third temperature is lower than a value obtained by subtracting a predetermined temperature from the fourth temperature.

6. The method according to claim 5, wherein the detecting of the first and second temperatures are performed via using thermistors.

7. The method according to claim 5, wherein the detecting of the third and fourth temperatures are performed via using thermistors.

8. The method according to claim 5, wherein the heating element comprises an IGBT or a MOSFET.

* * * * *